(12) United States Patent
Behle et al.

(10) Patent No.: US 7,931,955 B2
(45) Date of Patent: *Apr. 26, 2011

(54) COMPOSITE MATERIAL MADE FROM A SUBSTRATE MATERIAL AND A BARRIER LAYER MATERIAL

(75) Inventors: Stephan Behle, Hahnheim (DE); Lutz Klippe, Wiesbaden (DE); Matthias Bicker, Mainz (DE); Marten Walther, Engelstadt (DE)

(73) Assignee: Schott AG, Mainz (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/486,056
(22) PCT Filed: Aug. 7, 2002
(86) PCT No.: PCT/EP02/08853
§ 371 (c)(1), (2), (4) Date: Jul. 16, 2004
(87) PCT Pub. No.: WO03/014415
PCT Pub. Date: Feb. 20, 2003

(65) Prior Publication Data
US 2004/0247948 A1 Dec. 9, 2004

(30) Foreign Application Priority Data
Aug. 7, 2001 (DE) .................. 101 39 305

(51) Int. Cl.
B32B 7/02 (2006.01)
(52) U.S. Cl. ........ 428/215; 428/216; 428/336; 428/432; 428/451
(58) Field of Classification Search .................. 428/451, 428/215, 216, 336, 432; 427/575, 576, 579, 427/255.36, 255.37, 563, 564
See application file for complete search history.

(56) References Cited

U.S. PATENT DOCUMENTS

| | | | | |
|---|---|---|---|---|
| 4,725,109 A | * | 2/1988 | Wank et al. | 359/890 |
| 5,508,075 A | * | 4/1996 | Roulin et al. | 428/35.7 |
| 5,670,224 A | * | 9/1997 | Izu et al. | 428/35.8 |
| 5,679,412 A | * | 10/1997 | Kuehnle et al. | 427/534 |
| 5,736,207 A | * | 4/1998 | Walther et al. | 428/34.7 |
| 5,798,139 A | | 8/1998 | Nagashima et al. | 427/237 |
| 5,833,752 A | | 11/1998 | Martin | 118/723 |
| 6,001,429 A | | 12/1999 | Martin | 427/536 |
| 6,136,386 A | | 10/2000 | Nakahigashi et al. | 427/536 |
| 6,398,960 B1 | | 6/2002 | Borden et al. | 210/610 |
| 6,426,144 B1 | | 7/2002 | Grünwald et al. | 428/412 |
| 7,109,070 B2 | * | 9/2006 | Behle et al. | 438/149 |
| 2001/0038894 A1 | * | 11/2001 | Komada | 428/34.6 |
| 2003/0113564 A1 | | 6/2003 | Noda et al. | 428/480 |

FOREIGN PATENT DOCUMENTS

DE 196 34 795.5 A1 3/1998
(Continued)

OTHER PUBLICATIONS

Office Action for the corresponding Japanese Patent Application No. 2003-519542 dated Nov. 4, 2008.

*Primary Examiner* — D. S Nakarani
(74) *Attorney, Agent, or Firm* — Ohlandt, Greeley, Ruggiero & Perle, LLP

(57) ABSTRACT

A composite material having a substrate material and at least one barrier coating on one side of the substrate material. The barrier coating is plasma impulse chemical vapor deposited (PICVD) to the substrate material. The barrier coating includes at least one of material selected from the group consisting of $SiO_x$, $TiO_x$, $SnO_x$, $Si_3N_y$, $Nb_2O_y$, and $Al_2O_y$.

17 Claims, 2 Drawing Sheets

FOREIGN PATENT DOCUMENTS

| | | |
|---|---|---|
| EP | 0 709 485 A1 | 5/1996 |
| EP | 1 022 354 A2 | 7/2000 |
| JP | 1170611 | 3/1999 |
| JP | 11348171 | 12/1999 |
| WO | WO 96/33098 | 10/1996 |
| WO | WO96/33098 | 10/1996 |
| WO | WO99/19229 | 4/1999 |

* cited by examiner

COMPOSITE MATERIAL MADE FROM A SUBSTRATE MATERIAL AND A BARRIER LAYER MATERIAL

BACKGROUND OF THE INVENTION

1. Field of the Invention

The invention relates to a composite material having a substrate material and at least one barrier coating applied to one side of the substrate material, and to a process for producing a composite material comprising a substrate material and at least one barrier coating.

2. Description of Related Art

To reduce the permeation of gases and liquids in the field of plastic packaging and to protect the plastic material from chemical attack or UV radiation, it is advantageous for substrate materials, in particular plastic substrates, to be provided with a barrier coating. Barrier coatings allow the same property to be achieved with inexpensive bulk plastics as with expensive specialty plastics and make it possible to replace glass, for example, in the field of pharmaceutical packaging materials with bulk plastics of this type. Applications of barrier coatings to a plastic substrate have been disclosed by the following applications:

U.S. Pat. No. 5,798,139
U.S. Pat. No. 5,833,752
U.S. Pat. No. 6,001,429

U.S. Pat. No. 5,798,139 describes the production of plastic containers with a carbon film coating. The carbon film is intended to form a gas barrier and to solve the problem of sorption from the plastic material.

U.S. Pat. No. 5,833,752 has disclosed a system in which the barrier coating is applied from a plasma. The energy used to maintain the plasma is applied by devices which are distinguished by the fact that the energy is introduced into the interior of the containers to be coated via an outer electrode.

U.S. Pat. No. 6,001,429 again discloses the application of a barrier layer to the inner surface of a plastic substrate, with HMDSO as monomer gas together with an oxygen carrier gas being passed into the interior of the item which is to be coated.

It is an object of the invention, working on the basis of U.S. Pat. No. 5,833,752 and/or U.S. Pat. No. 6,001,429, to provide a composite material and a process for producing a composite material of this type which is distinguished by an improved barrier action and improved bonding to the plastic material.

SUMMARY OF THE INVENTION

The inventors have discovered that by using a plasma-enhanced CVD process, a so-called PICVD process, the required good bonding is achieved, and so is excellent barrier action with respect to substances from the atmosphere, substances contained in the plastic or substances released from the plastic, as well as substances which are in contact with the surface of the composite material. In particular, the use of a PICVD process makes it possible to use surface temperatures of typically 50 to 150° C., i.e. thermally sensitive plastics can be provided with an excellent barrier coating without damage to the plastic surface. Very thin layers, even down to monomolecular layers, with barrier properties can be applied to a substrate material with the aid of the PICVD processors. This allows a considerable saving on materials. Furthermore, layers of this type are distinguished by a high degree of flexibility.

The use of a PICVD process also makes it possible to employ multi-position installations, which in particular leads to a high throughput.

According to the invention, the barrier coating comprises at least one of the following materials: $SiO_x$ with $0 \leq x \leq 2$, $TiO_x$ with $0 \leq x \leq 2$, amorphous hydrocarbons, electrically conductive layers, $SnO_x$ with $0 \leq x \leq 2$, $Si_xN_y$ with $0 \leq x \leq 3$ or x $0 \leq x \leq 1$, $0 \leq y \leq 4$, $Nb_xO_y$ with $0 \leq x \leq 2$, $0 \leq y \leq 5$, $Al_xO_y$ with $0 \leq x \leq 2$, $0 \leq y \leq 3$.

Moreover, particularly good barrier actions can be achieved with a barrier coating on at least one side of the substrate material which is applied by means of plasma impulse chemical vapor deposition (PICVD) and comprises at least one of the following materials:

$SiO_x$ with $x<2$, in particular with $1.7 \leq x<2$;
$SiO_x$ with $x>2$, in particular with $2<x \leq 2.5$;
$TiO_x$ with $x<2$, in particular with $1.7 \leq x<2$;
$TiO_x$ with $x>2$, in particular with $2<x \leq 2.5$;
$SnO_x$ with $x<2$, in particular with $1.7 \leq x<2$;
$SnO_x$ with $x>2$, in particular with $2<x \leq 2.5$;
$Si_3N_y$ with $y<4$, in particular with $3.5<y<4$;
$Si_3N_y$ with $y>4$, in particular with $4<y<4.5$;
$Nb_2O_y$ with $y<5$, in particular with $4<y<5$;
$Nb_2O_y$ with $y>5$, in particular with $5<y<6$;
$Al_2O_y$ with $y<3$, in particular with $2.5<y<3$;
$Al_2O_y$ with $y>3$, in particular with $3<y<3.5$.

Slightly substoichiometric or superstoichiometric layer compositions of this type result in very dense and compact layer structures with long diffusion paths.

The barrier coating may also particularly advantageously have a composition or structure which varies perpendicular to the coated surface of the substrate. The variation may in this case be continuous or stepped. A stepped variation results in a multilayer barrier coating. By way of example, the bottom layer, which is in contact with the surface of the substrate, can be used as a bonding layer for the subsequent coatings. Layers of this type may, for example, be produced by a continuous or stepped change in the precursor content in the process gas during the coating operation.

Barrier coatings of this type may, for example, comprise alternating layers, such as for example an alternating $TiO_x$/$SiO_x$ layer. In this case, the $TiO_x$ layer is preferably in contact with the substrate. By way of example, the individual layers of the alternating layer can be produced with a thickness of from 5 nm to 100 nm. A particularly good barrier action can be achieved with an approximately 100 nm thick layer. To achieve a high throughput and therefore to improve the process economics, however, coatings with lower layer thickness are also advantageous.

Particularly good coating properties can in this case also be achieved with multiple alternating layers. A multiple alternating layer of this nature may, for example, comprise an alternating $TiO_x$/$SiO_x$/$TiO_x$/$SiO_x$/layer. Alternating layers of this type may particularly advantageously be used for the coating of films, including for coating on both sides. Films, since they generally have only a low material thickness, have only a poor barrier action, and consequently the good barrier action of the alternating layers nevertheless ensures that diffusion rates through the film are low.

The plastic substrate preferably comprises one or more of the following materials:
polycyclic hydrocarbons, polycarbonates,
polyethylene terephthalates,
polystyrene, polyethylene, in particular HDPE,
polypropylene, polymethyl methacrylate, PES. In particular, it is possible, as a result of application by means of a PICVD process, to coat polycyclic hydrocarbons, such as COC, which themselves already represent a high-density barrier plastic, in such a manner that this high-density barrier plastic is protected from attack by organic substances, in particular fats or greases.

In a preferred embodiment, the thickness of the barrier coating is <1000 nm, preferably <300 nm. In addition to good barrier properties, barrier layers of this type are also highly flexible. Furthermore, with such thin layers it is in particular also possible to avoid intrinsic stresses which can cause the barrier layer to flake off. In a particularly preferred embodiment, the barrier layer has still further additional functions, for example optical or electrical functions or nonscratch or antireflection functions. By way of example, an optical interference coating which simultaneously acts as a barrier layer can be used in organic LEDs, known as OLEDs, or in the field of photovoltaic cells.

However, with the invention it is also possible to produce very much thinner layers. Barrier coatings of this type may have thicknesses of from 5 nm, preferably from 15 nm, in particular from 20 nm.

In addition to the composite material, the invention also provides a process for producing a composite material of this type, which is distinguished by the fact that in a coating reactor a plasma is generated by means of a pulse, with the result that precursor gases which are introduced into the reactor react with the gas atmosphere in the coating reactor and are deposited on the substrate material for a barrier coating. Transparent barrier layers result if the following precursor materials are used: HMDSN, HMDSO, PMS, silane in $N_2$, $TiCl_4$ in an atmosphere comprising $O_2$, $N_2$, $N_2$ $NH_3$. Materials of this type allow $TiO_2$, $SiO_2$ and $Si_xN_y$ barrier layers to be deposited on various plastic materials. A $TiO_2$ barrier layer is deposited, for example, if a $TiCl_4$ precursor gas in an $O_2$ atmosphere is used, while an $SiO_2$ barrier layer is deposited when a HMDSN precursor gas in an $O_2$ atmosphere is used, and an Si—N barrier layer is deposited if an $SiH_4$ or TMS precursor in an $N_2+NH_3$ atmosphere is used.

In this case, the coating reactor is advantageously evacuated after the substrate material has been introduced into the coating reactor and before precursor gases are introduced. This means that there is no need to provide a lock arrangement for transferring the substrates which are to be coated from atmospheric pressure into an evacuated reactor.

The substrate material which is to be coated may in particular also comprise a hollow body. Therefore, the process according to the invention allows a coating to be deposited on the inner side and/or outer side of the hollow body. In the case of internal coating, it is also advantageous for the area surrounding the hollow body to be evacuated to a pressure of less than 200 mbar, preferably between 10 and 100 mbar, prior to the coating, and at the same time for the interior of the hollow body to be evacuated to a base pressure of less than 1 mbar, preferably between 0.3 and 0.05 mbar, so that the walls of the hollow body are not coated on by large pressure differences, which, in the case of thin-walled material, could lead to deformation of the hollow body.

Furthermore, to coat exclusively the inner side, the external pressure is advantageously selected in such a way that no plasma is ignited in the outside space. To avoid large pressure differences even during the evacuation process, it is in this case advantageously possible initially to evacuate uniformly, in such a way that the external pressure mentioned above is reached, and then for just the inside to be evacuated further to a base pressure of less than 1 mbar, preferably between 0.05 and 0.3 mbar.

The $O_2$ permeability is determined in accordance with DIN 53380, the content of disclosure of which is hereby incorporated in its entirety in the present application. According to DIN 53380, in the case of films the specimen is clamped in a gastight manner between the two parts of the permeation chamber. Nitrogen flows slowly through one part of the chamber, while oxygen flows slowly through the other part of the chamber. The oxygen which migrates through the film into the nitrogen carrier gas is transported to an electrochemical sensor, where the oxygen produces an electrical current intensity which is proportional to the quantitative flow of oxygen.

If hollow bodies are tested, the nitrogen carrier gas stream is passed directly through the hollow body. The oxygen acts on the hollow body from the outside.

In particular the $TiO_2$ barrier layer and the $SiO_2$ barrier layer, which have been produced by means of a PICVD process in the manner described above, are distinguished by particularly good barrier properties. For example, the oxygen permeation and also the water vapor permeation through the coated materials are significantly increased by the barrier coating compared to the uncoated substrate material, as shown in the table below. Also, the coating of $SiO_2$ on polycarbonate has a high resistance to solvents. The barrier action is given as BIF in Table 1. BIF is in this case the quotient of the measured $O_2$ or water vapor permeability of the uncoated body/$O_2$ or water vapor permeability of the coated body.

The water vapor permeability of the uncoated and coated bodies is determined in accordance with DIN 53122, the content of disclosure of which is hereby incorporated in its entirety in the present application. In accordance with DIN 53122, a dish holding absorption agent is closed off by the specimen using wax and stored in a humid atmosphere. The quantity of water vapor which passes through the specimen is calculated from the increase in the weight of the dish as soon as this increase becomes linear when plotted against time.

The microwave power range which is favorable for good-quality coatings is in this case between 300 W and 12 kW, in particular between 600 W and 11 kW pulse power.

BRIEF DESCRIPTION OF THE DRAWINGS

The invention is to be explained in more detail below with reference to the exemplary embodiment and the figures, in which.

DETAILED DESCRIPTION OF THE INVENTION

TABLE 1

Action of the barrier coating

| Material | Coating | Thickness [nm] | Water vapor resistance [BIF] | $O_2$ resistance [BIF] | Solvent resistance |
|---|---|---|---|---|---|
| COC | $SiO_2$ | 20 - 100 | 3 | >10 | |
| PC | $SiO_2$ | 20 - 100 | 3 | >24 | Acetone >10 min |
| PET | $SiO_2$ | 20 - 100 | 2 | >20 | |
| | $SiO_2$ | 20 - 100 | >50 | | |
| | 2 × $TiO_2$ | 20 - 100 | >10 | >$10^2$ | |
| PES | 2 × $SiO_2$ | 20 - 100 | >6 × $10^2$ | >6 × $10^2$ | |
| HDPE | | 20 - 100 | >10 | | |
| PP | $SiO_2$ | 20 - 100 | | >2 | |

Figure 1:
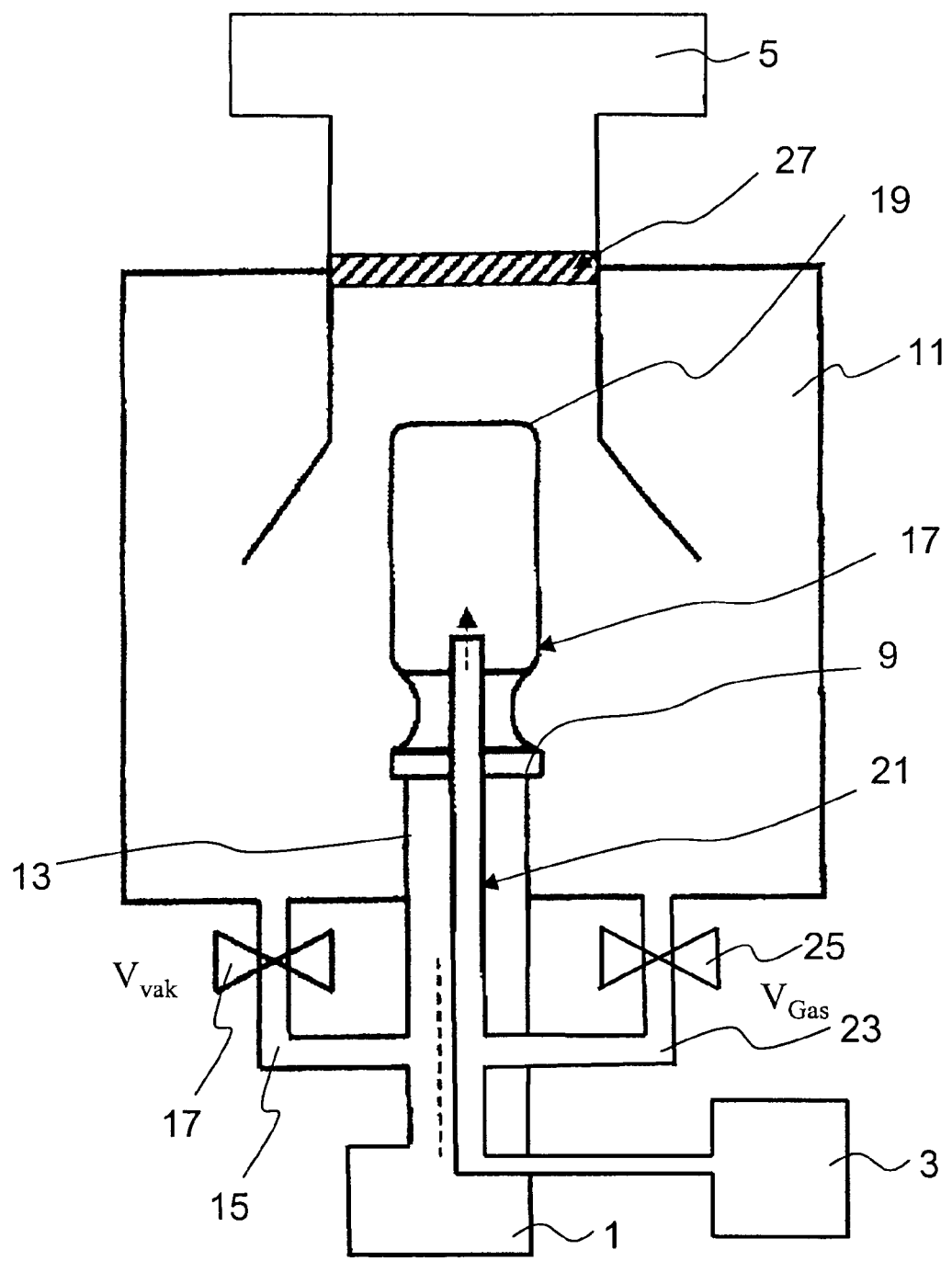
FIG. 1 shows a PICVD coating station for a hollow body.

The text which follows is intended to provide an exemplary embodiment of the invention, in which polycarbonate has been selected as substrate material in the form of a hollow body. The polycarbonate hollow body was provided with an $O_2/H_2O$ barrier layer in accordance with the invention. The bottles were coated at a PICVD coating station for glass bottles, as described in similar form, for example, in U.S. Pat. No. 5,736,207, the content of the disclosure of which is hereby incorporated in the present application. The apparatus used for the coatings differs from the apparatus disclosed by U.S. Pat. No. 5,736,207 in terms of the size of the receivable substrates which are to be coated. In the apparatus used for the coating in accordance with the invention, it is possible to receive and coat substrates with a volume of up to 5000 ml. An embodiment of a coating station of this type for 3D bodies, for example bottles or vials, is shown in FIG. 1. The coating station shown in FIG. 1 comprises a vacuum apparatus 1, a gas generator 3 and a microwave generator 5 for generating microwaves which in turn generate a plasma for a predetermined time in the coating reactor, which in the present case is formed by the 3D hollow body 7 which is to be coated. Furthermore, the coating station comprises a receiving device 9 for holding the 3D hollow body 7 which is to be coated on the inside. In a first embodiment, the 3D hollow bodies 7 can only be evacuated on the inside. To avoid mechanical deformation during the coating operation, it is also possible for the space outside the hollow body which is to be coated to be evacuated. For this purpose, an evacuable receptacle 11 is arranged around the 3D hollow body 7. A structure of this type results in the possibility of carrying out an external coating as an alternative to or at the same time as the internal coating.

The 3D hollow body and/or receptacle is evacuated using vacuum pump devices in accordance with the prior art. The volume which is enclosed by the hollow body and is to be evacuated is in this case preferably in a range from 10 ml to 5000 ml, in particular in a range from 50 ml to 2000 ml.

The 3D hollow body is evacuated via vacuum line 13, and the receptacle 11 is evacuated via vacuum line 15. To enable the receptacle 11 optionally to be evacuated in addition to the interior of the 3D hollow body, a valve 17 is provided. As mentioned above, in the present exemplary embodiment the inner wall 19 of the 3D hollow body 7 itself forms the actual coating chamber. Following the evacuation of the interior of the 3D hollow body 7, the interior of the hollow body is filled with a precursor gas, for example with a mixture of HMDSN or HMDSO and oxygen, via feedline 21, the concentration of HMDSO/HMDSN lying, for example, in the range between 1 and 10% of the oxygen flow. As an option for the introduction of the precursor gas and oxygen into the interior of the 3D hollow body 7 which is to be coated, it is possible for precursor gas and oxygen to be passed into the receptacle 11 via feedline 23 for external coating. Once again, a valve 25 is arranged in the feedline 23. After the filling step, the pressure in the coating reactor is between 1.2 and 0.2 mbar. After the evacuation, microwave power is introduced into the 3D hollow body 7 which is to be coated and/or the receptacle 11. The introduction of the microwave power by the microwave generator 5, which may, for example, be a magnetron, into the receptacle or 3D hollow body is performed via a dielectric window 27 arranged above the 3D hollow body 7. Other ways of introducing the microwave power, for example via antennas, would be possible. A pulsed plasma is generated inside the hollow body with the aid of the microwave power which is supplied and is preferably time-modulated. Typical pulse lengths are between 0.1 and 20 ms, with an interpulse period in the range from 5 to 400 ms. The advantages of coating with the aid of pulses in accordance with the invention lie in the low thermal load on the plastic substrate.

Furthermore, full gas exchange can be carried out during the interpulse periods, so that the gas composition is always ideal at the start of the next microwave pulse. The abovementioned parameter ranges for pulse length and interpulse period have proven particularly favorable in order to ensure good gas exchange combined, at the same time, with a low thermal load and rapid layer growth. The results of the hollow bodies which have been coated using the process described above are summarized in the table below:

TABLE 2

Internally coated polycarbonate bottles with an $O_2/H_2O$ barrier, layer thickness: 100 nm

| Pressure [mbar] | $O_2$ Flow rate | HMDSN [sccm] | Pulse length [ms] | Interpulse period [ms] | Mean MW power (pulse power) | Barrier improvement factor $H_2O$ | Barrier improvement factor $O_2$ |
|---|---|---|---|---|---|---|---|
| 1 - 0.3 | 200 - 50 | 5 - 0.1 | 2.0 - 0.5 | 50 - 10 | 100 W - 200 W (2.0 kW - 4.0 kW) | 3 | 2 - 20 |

As an alternative to coating 3D hollow bodies, according to the invention it is also possible to coat sheet-like substrates, for example films, or panels. Substrates in panel form may, for example, be display covers for LCD displays. In this context, the barrier coatings may also provide further functional properties, such as for example antireflection properties or a non-scratch coating.

Figure 2:
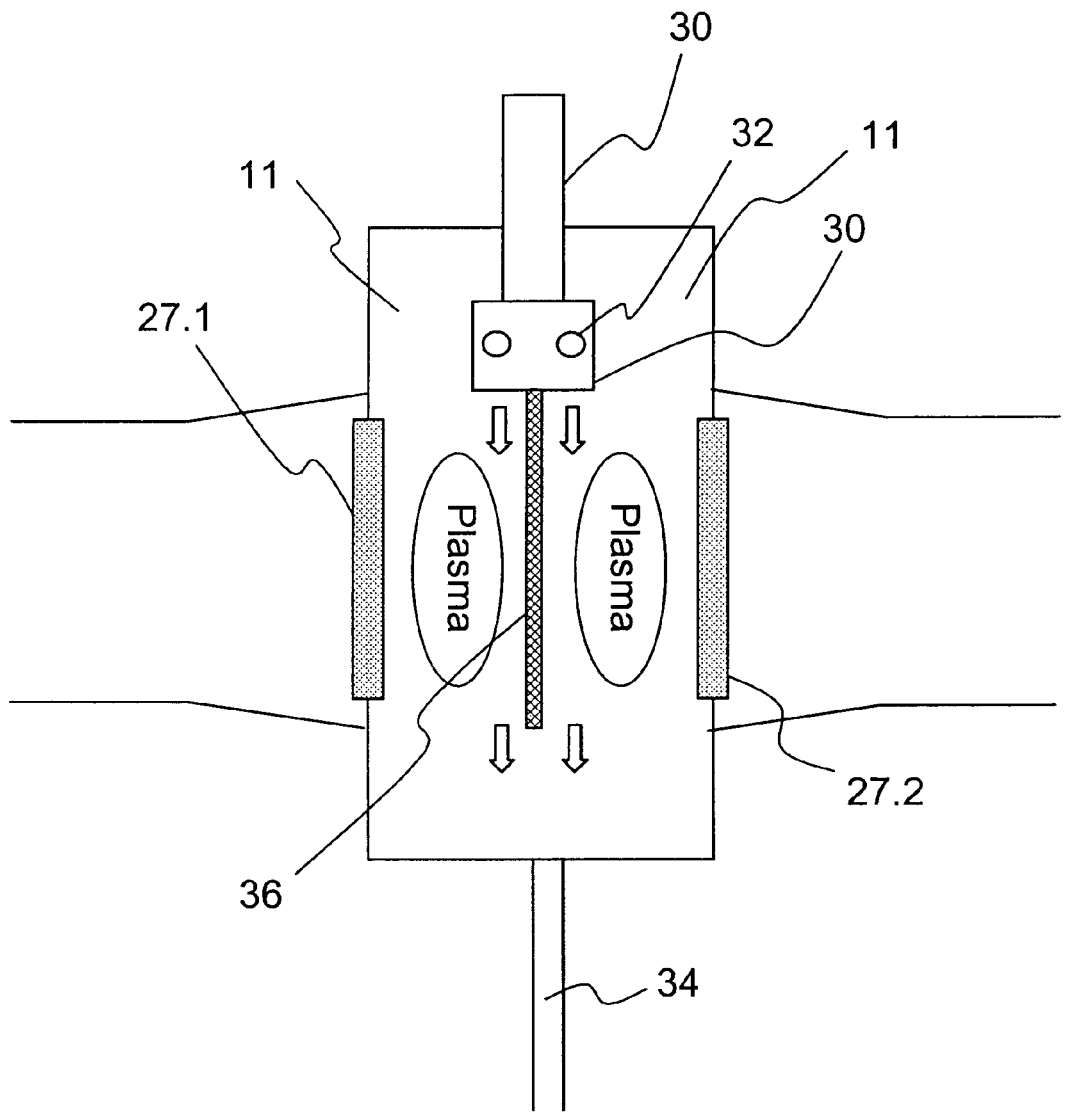
FIG. 2 shows a PICVD coating station for a film.

FIG. 2 shows a coating device for bodies of this type. Components which are identical to those shown in FIG. 1 are provided with the same reference symbols. Unlike in FIG. 1, the object which is to be coated does not itself form the coating chamber, but rather it is held in a receptacle 11 by means of a holder 30. The holder 30 comprises gas outlets 32 from which precursor gas and oxygen are passed into the receptacle 11 after the receptacle has been evacuated via line 34. A plasma is ignited inside the receptacle 11 by means of the microwave power which is introduced on both sides of the receptacle via dielectric windows 27.1, 27.2, and the substrate 36 is coated. The microwave power is preferably pulsed.

The advantage of plasma excitation with the aid of microwaves, i.e. a frequency of 90-3000 MHz, in particular 300-2500 MHz, compared to excitation with radio frequency (RF) as in the prior art, is in particular the thinner edge layer which is formed with microwave excitation. In a thin edge layer, the ions of the plasma can only absorb a small amount of energy, and consequently they only possess a low kinetic energy when they make contact with the substrate which is to be coated, and thereby can only cause minor damage, for example as a result of introduction of heat or charging. On account of these advantages, the plasma generated using microwaves can be operated with significantly higher powers and higher pressures than in the prior art, resulting in advantages, for example, in the deposition rate.

Excitation using pulsed radio frequency may also, however, be advantageous for various applications, for example in order to generate more homogeneous field distributions in the plasma and therefore particularly uniform coatings in the case of a long wavelength. In this context, the frequency range below 90 MHz, in particular in the range from 10 MHz to 90 MHz, is appropriate.

The invention for the first time provides a composite material with improved barrier properties as well as a process for producing a material of this nature.

The invention is to be explained in more detail below on the basis of the exemplary embodiments:

Exemplary Embodiment 1

A bottle made from polyethylene terephthalate (PET) with a volume of 0.5 l is simultaneously evacuated on the outside to a pressure of 85 mbar and on the inside initially to a base pressure of less than 0.09 mbar. Subsequently, a mixture of oxygen and hexamethyldisilazane (HMDSN) is passed into the interior of the bottle at a pressure of 0.3 mbar. Then, pulsed microwave energy with a pulse power of 5 kW and a frequency of 2.45 GHz is introduced and a plasma is ignited in the container. The coating is carried out with a growth rate of approximately 0.89 nm layer thickness growth per second.

a) Oxygen and Water Vapor Barrier:

Over the course of 90 seconds, the container is internally coated with 80 nm of $SiO_x$. This corresponds to a growth rate of 0.89 nm/s. Immediately afterward, the bottle is ventilated and removed. Measurements carried out to test the water vapor permeation in accordance with DIN 53122, Part 1 using a gravimetric measurement method give a value of 14.3 mg/(specimen×day) for the coated bottle, whereas a water vapor permeation of 28.0 mg/(specimen×day) is measured for the uncoated bottle. This gives a barrier improvement factor (BIF) of 2.0. Measurements carried out on the oxygen permeability in accordance with DIN 53380-3 using an electrochemical sensor give a value of 0.018 $cm^3$/(specimen×day×bar) for the coated bottle and a value of 0.15 $cm^3$/(specimen×day×bar) for the uncoated bottle, and therefore the $O_2$ BIF is 8.3.

b) Oxygen and Water Vapor Barrier in a Short Coating Time:

An internal coating of $SiO_x$ in a layer thickness of 20 nm is carried out within 18 seconds, corresponding to a deposition rate of approximately 1.1 nm/s. The container is then flooded with gas and removed from the apparatus. Measurements carried out on the water vapor permeation give a value of 25.3 mg/(specimen×day) for the coated bottle. This gives a $H_2O$ BIF of 1.1. Measurements carried out on the oxygen permeability give a value of 0.036 $cm^3$ (specimen×day×bar), and consequently the $O_2$ BIF is 4.

c) Oxygen Barrier within a Very Short Coating Time, Low Heating:

The inside of the bottle is coated with $SiO_x$ in a layer thickness of 10 nm within 9 seconds. The container is then flooded with gas and removed from the apparatus. Measurements carried out on the oxygen permeability give a value of 0.062 $cm^3$/(specimen×day×bar) and therefore an $O_2$ BIF of 2.

The short coating time means that the specimen is only heated slightly.

d) Controlling the Heating Rate by Pulse Length and Interpulse Period:

By suitably selecting the pulse length and interpulse period, it is possible to have a deliberate influence on the heating of the specimens during the coating. At a microwave power of 1000 W with pulse lengths of 0.5 ms and interpulse periods of 200 ms, it is possible to achieve heating rates of less than 0.3° C./s. This is advantageous in particular for coating plastics, since many plastics, such as for example PET, are deformed and crystallized even at temperatures over 80° C., with the result that cracks may form in the layer or the layer may flake off from the plastic substrate.

Exemplary Embodiment 2

High Oxygen Barrier at Low Microwave Power:

A 0.5 l bottle made from polyethylene terephthalate (PET) is simultaneously evacuated on the outside to a pressure of 85 mbar and on the inside initially to a base pressure of less than 0.09 mbar. Subsequently, a mixture of oxygen and hexamethyldisilazane (HMDSN) is passed into the interior of the bottle at a pressure of 0.4 mbar. Then, pulsed microwave energy with a pulse power of 1000 W and a frequency of 2.45 GHz is introduced, so that a plasma is ignited in the container.

A 100 nm thick single layer of $SiO_x$ is applied in 98.4 seconds, corresponding to a deposition rate of approximately 1 nm/s. Then, the specimen is flooded with nitrogen and removed. Measurements carried out on the water vapor permeation give a value of 18.7 mg/(specimen×day) for a coated bottle and 22.5 mg/(specimen×day) for an uncoated bottle. This means that the $H_2O$ BIF is 1.2. The oxygen permeation is 0.0015 $cm^3$/(specimen×day×bar) for an uncoated bottle and 0.18 $cm^3$/(specimen×day×bar) for an uncoated bottle, giving an $O_2$ BIF of 82.

Exemplary Embodiment 3

Double Layer with Improved Bonding

Variant 1:

A substrate, for example a 0.5 l bottle made from polyethylene terephthalate (PET) is simultaneously evacuated on the outside to a pressure of 85 mbar and on the inside initially to a base pressure of less than 0.09 mbar. Subsequently, first of all a mixture of oxygen and hexamethyldisilazane (HMDSN) with a high precursor content which amounts to 10% of the $O_2$ flow is introduced into the interior of the bottle at a pressure of 0.4 mbar. Then, pulsed microwave energy with a pulse power of 1000 W and a frequency of 2.45 GHz is introduced, so that a plasma is ignited in the container. A layer with a thickness of 5-25 nm is applied and acts as a bonding agent between plastic and barrier layer but also may have a slight barrier action with respect to gases. Immediately thereafter, a mixture of oxygen and hexamethyldisilazane (HMDSN) with a low precursor content amounting to ≦2% of the oxygen flow rate flows into the container. Once again, a pulsed microwave plasma is ignited and a second layer is applied, with a thickness of between 25 and 45 nm. This layer has a high barrier action against gases.

Variant 2, Internal Coating of a 0.5 l Pet Bottle (Wall Thickness 0.5 mm) with a Bonding Agent/Barrier Composite with Improved Bonding:

A bottle made from polyethylene terephthalate (PET) with a volume of 0.5 l is simultaneously evacuated to a pressure of 85 mbar on the outside and initially to a base pressure of less than 0.1 mbar on the inside. Subsequently, a mixture of oxygen and hexamethyldisilazane (HMDSN) is passed into the interior of the bottle at a pressure of 0.3 mbar. Then, pulsed microwave energy with a pulse power of 1000 watts and a frequency of 2.45 GHz is introduced and a plasma is ignited in the container.

i) Firstly, as in Variant 1, an organic bonding agent layer is applied, but this time in a thickness of 100 nm at a high HMDSN concentration.

ii) This is followed by a rapid gas change to a lower HMDSN concentration of 2%, and an inorganic barrier layer with a layer thickness of 50 nm is applied over the course of 26 seconds, corresponding to a rate of 1.9 nm/s.

The coating makes it possible to produce a bonding agent/barrier composite with a high $O_2$ barrier improvement factor ($O_2$ BIF) of significantly over 40.

The permeation through the uncoated bottle is 0.125 $cm^3$/(specimen×day×bar), and that through the coated bottle is significantly below 0.003 $cm^3$/(specimen×day×bar).

The resolution limit of the Mocon-Oxtran measurement appliance used was then reached.

Variant 3, Internal Coating of a 0.4 l Pet Bottle (Wall Thickness: 0.4 mm) with a Bonding Agent/Barrier Composite, Comparison Between Barrier/Bonding Agent Composite and Pure Barrier Layer:

A bottle made from polyethylene terephthalate (PET) with a volume of 0.4 l is simultaneously evacuated to a pressure of 85 mbar on the outside and initially to a base pressure of less than 0.1 mbar on the inside. Subsequently, a mixture of oxygen and hexamethyldisilazane (HMDSN) is passed into the interior of the bottle at a pressure of 0.3 mbar. Then, pulsed microwave energy with a pulse power of 1000 watts and a frequency of 2.45 GHz is introduced and a plasma is ignited in the container.

i) Bonding Agent/Barrier Composite:

First of all, as in Variant 2, an organic bonding agent layer is applied, but this time in a thickness of 10 nm with a high HMDSN concentration.

This is followed by a rapid gas change to a lower HMDSN concentration of 1.5%, and an inorganic barrier layer with a layer thickness of 15 nm is applied over the course of 11.4 seconds.

The coating makes it possible to produce a bonding agent/barrier composite with a high $O_2$ barrier improvement factor ($O_2$ BIF) of 18.7, as revealed by the following data: the permeation of the uncoated bottle is 0.196 $cm^3$/(specimen×day×bar), and that of the coated bottle is below 0.0104 $cm^3$/(specimen×day×bar).

Exemplary Embodiment 4

Gradient Layer with Improved Bonding

A 0.5 l bottle made from polyethylene terephthalate (PET) is simultaneously evacuated to a pressure of 85 mbar on the outside and initially to a base pressure of less than 0.9 mbar on the inside. Subsequently, a mixture of oxygen and hexamethyldisilazane (HMDSN) or hexamethyldisiloxane (HMDSO) is introduced into the interior of the bottle at a fixed pressure of, for example, 0.4 mbar, and a pulsed microwave plasma is ignited. A gradient layer is applied to the substrate; one option for production of this gradient layer is, as described in EP 0718418A1, the content of disclosure of which is hereby incorporated in its entirety in the present application, is to continuously alter at least one of the parameters pulse length and/or interpulse period during the layer growth. Another alternative is for the gradient layer to be produced by a continuous or stepped change in at least one of the coating parameters microwave power, pulse length, interpulse period, oxygen or precursor flow rate. The gradient layer produces improved bonding combined, at the same time, with a high barrier action. Gradient layers of this type can also be applied to any other desired substrate. These gradient layers produced in this way have a stoichiometric or structural variation in a direction perpendicular to the surface.

Exemplary Embodiment 5

HDPE

Variant 1

A hollow body made from high density polyethylene (HDPE), volume 70 ml, is evacuated to a pressure of less than 0.1 mbar. Subsequently, a mixture of oxygen and hexamethyldisilazane (HMDSN) is passed into the container at a pressure of 0.6 mbar and pulsed microwave energy is introduced with an pulse power of 2.7 kW. A plasma is ignited and an $SiO_x$ layer is deposited with a thickness of a) 80 nm in 70 seconds, corresponding to a deposition rate of 1.14 nm/s, and b) 300 nm in 270 seconds, corresponding to a deposition rate of 1.11 nm/s.

An uncoated specimen has an $O_2$ permeation of 0.86 $cm^3$/(specimen×day×bar), the 80 nm thick specimen has an $O_2$ permeation of 0.62 $cm^3$/(specimen×day×bar), and the 300 nm thick specimen has an $O_2$ permeation of 0.33 $cm^3$/(specimen×day×bar).

Variant 2

A hollow body made from high density polyethylene (HDPE), volume 500 ml, is evacuated to a pressure of less than 0.1 mbar. Subsequently, a mixture of oxygen and hexamethyldisilazane (HMDSN) is passed into the container at a pressure of 0.3 mbar and pulsed microwave energy with a pulse power of 1000 W is introduced. A plasma is ignited, and at a high HMDSN concentration a) a bonding agent layer with a thickness of 20 nm is deposited. A barrier layer with a thickness of 10 nm is applied to this bonding agent layer over the course of 12 seconds, b) a bonding agent layer with a thickness of 20 nm is deposited. A barrier layer with a thickness of 80 nm is applied to this bonding agent layer over the course of 71.2 seconds.

An uncoated specimen has an $O_2$ permeation of 3.04 $cm^3$/(specimen×day×bar), the specimen produced in accordance with process a) has an $O_2$ permeation of 0.80 $cm^3$/(specimen×day×bar), and the specimen produced in accordance with process b) has an $O_2$ permeation of 0.55 $cm^3$/(specimen×day×bar). This results in an $O_2$ BIF of a) 3.8 and b) 5.5.

Exemplary Embodiment 6

PET Film

A 100 μm thick PET film is fitted into a receptacle which is then evacuated. Subsequently, a mixture of oxygen and a) titanium chloride, b) hexamethyldisilazane is passed into the reactor and a pressure of 0.2 mbar is set. Thereupon, microwave energy with a pulse power of 11 kW is introduced into the reactor from one side and a plasma is ignited.

a) A 100 nm thick $TiO_x$ layer is deposited on one side of the film. The reactor is then ventilated and the film removed. Measurement of the water vapor permeation in accordance with DIN 53122, Part 1 gives a value of 0.020 g/($m^2$/day) for the coated film, while an $H_2O$ permeation of 1.96 g/(m²/day) is determined for an uncoated film. The $H_2O$ BIF is therefore 98.

b) A 100 nm thick $SiO_x$ layer is deposited. Measurement of the water vapor permeation gives a value of 0.4 g/(m²/day) and therefore an $H_2O$ BIF of 4.9.

Exemplary Embodiment 7

PES Film, Coated on Both Sides

A 25 µm thick film of polyether sulfone (PES) is fitted into a receptacle and the receptacle is then evacuated. Subsequently, a mixture of oxygen and a) titanium chloride, b) hexamethyldisilazane is passed into the reactor and a pressure of 0.2 mbar is set. Thereupon, microwave energy is introduced into the reactor and a plasma ignited in each case from one side.

a) With a pulse power of in each case 11 kW, a 20 nm thick $TiO_x$ layer is deposited on both sides. Measurement of the oxygen permeation in accordance with DIN 53380-3 gives a value of 15.7 cm³/(m²×day×bar) for the coated film, while an $O_2$ permeation of 940 m³ (m²×day×bar) is determined for an uncoated film. The $O_2$ BIF is therefore 60.

b) At a pulse power of in each case 4 kW, a 100 nm thick $SiO_x$ layer is deposited on both sides. Measurement of the oxygen permeation gives a value of 1.51 cm³/(m²×day×bar) and therefore an $O_2$ BIF of 620.

Exemplary Embodiment 8

A film of 1) polystyrene (PS), 25 µm thick, 2) polycarbonate (PC), 20 µm thick, 3) polyether sulfone (PES), 25 µm thick, 4) high density polyethylene (HDPE), 10 µm thick, 5) polypropylene (PP), 30 µm thick and 6) fluorinated ethylene-propylene copolymer (FEP), 25 µm thick, is fitted into a receptacle and the receptacle evacuated. Subsequently, a mixture of oxygen and a) titanium chloride, b) hexamethyldisilazane is passed into the reactor and a pressure of 0.2 mbar is set. Thereupon, microwave energy with a pulse power of a) 11 kW for the production of $TiO_x$ and b) 4 kW for the production of $SiO_x$ is introduced into the reactor from one side and a plasma is ignited.

1a) A 50 nm thick $TiO_x$ layer is deposited. Measurement of the water vapor permeation gives a value of 0.76 g/(m²×day) for the coated PS film, whereas an $H_2O$ permeation of 91 g/(m²×day) is determined for an uncoated PS film. The $H_2O$ BIF is therefore 120.

1b) A 200 nm thick $SiO_x$ layer is deposited on one side. Measurement of the water vapor permeation gives a value of 0.2 g/(m²×day) and therefore an $H_2O$ BIF of 455.

2a) A 50 nm thick $TiO_x$ layer is deposited on one side. Measurement of the water vapor permeation gives a value of 0.5 g/(m²×day) for the coated PC film, whereas an $H_2O$ permeation of 11.5 g/(m²×day) is determined for an uncoated PC film. The $H_2O$ BIF is therefore 22.

2b) A 50 nm thick $SiO_x$ layer is deposited on one side. Measurement of the water vapor permeation gives a value of 0.62 g/(m²×day) and therefore an $H_2O$ BIF of 18.

3a) A 100 nm thick $TiO_x$ layer is deposited on one side. Measurement of the water vapor permeation gives a value of 3.69 g/(m²×day) for the coated PEF film, whereas an $H_2O$ permeation of 234.35 g/(m²×day) is determined for an uncoated PES film. The $H_2O$ BIF is therefore 63.

3b) A 50 nm thick SiO, layer is deposited on one side. Measurement of the water vapor permeation gives a value of 4.13 g/(m²×day) and therefore an $H_2O$ BIF of 56.

4a) A 50 nm thick $TiO_x$ layer is deposited on one side. Measurement of the water vapor permeation gives a value of 1.11 g/(m²×day) for the coated HDPE film, whereas an $H_2O$ permeation of 6.63 g/(m²×day) is determined for an uncoated HDPE film. The $H_2O$ BIF is therefore 6.

4b) A 200 nm thick $SiO_x$ layer is deposited on one side. Measurement of the water vapor permeation gives a value of 1.04 g/(m²×day) and therefore an $H_2O$ BIF of 6.3.

5a) A 50 nm thick $TiO_x$ layer is deposited on one side. Measurement of the water vapor permeation gives a value of 0.32 g/(m²×day) for the coated PP film, whereas an $H_2O$ permeation of 0.42 g/(m²×day) is determined for an uncoated PP film. The $H_2O$ BIF is therefore 1.3.

5b) A 50 nm thick $SiO_x$ layer is deposited on one side. Measurement of the water vapor permeation gives a value of 0.33 g/(m²×day) and therefore an $H_2O$ BIF of 1.3.

6a) At a pulse power of in each case 11 kW, a 50 nm thick $TiO_x$ layer is deposited on one side. Measurement of the water vapor permeation gives a value of 0.55 g/(m²×day) for the coated FEP film, whereas an $H_2O$ permeation of 3.64 g/(m²×day) is determined for an uncoated FEP film. The $H_2O$ BIF is therefore 6.5.

6b) With a pulse power of in each case 4 kW, a 50 nm thick $SiO_x$ layer is deposited on one side. Measurement of the water vapor permeation gives a value of 1.18 g/(m²×day) and therefore an $H_2O$ BIF of 3.

Exemplary Embodiment 9

PET Film with Alternating $SiO_x$/$TiO_x$ Layers

A 23 µm thick PET film is installed in a receptacle and the receptacle evacuated. Then, the following processes 1) and 2) are carried out alternately and repeatedly:

1) A mixture of oxygen and titanium chloride is passed into the reactor and a pressure of 0.2 mbar is set. thereupon, microwave energy with a pulse power of 11 kW is introduced into the reactor from one side and a plasma is ignited.

2) After the $TiO_x$ layer has been deposited, the reactor is immediately flushed with a gas mixture of oxygen and hexamethyldisilazane (HMDSN), and then a plasma is ignited at the same pressure but a pulse power of 4 kW and an $SiO_x$ layer is deposited.

a) Processes 1) and 2) are carried out once and an alternating layer comprising 100 nm of $TiO_x$ and 100 nm of $SiO_x$ is deposited. Subsequently, the receptacle is ventilated and the specimen removed. Measurements of the water vapor permeation of the coated film give a value of 0.055 g/(m²×day), and measurements of the water vapor permeation of an uncoated film give a value of 10.87 g/(m²×day). The $H_2O$ BIF is therefore a factor of 199.

b) Processes 1) and 2) are carried out twice and an alternating layer comprising 4 individual layers is then ventilated in the receptacle and the specimen removed. Measurements of the water vapor permeation of the coated film give a value of 0.04 g/(m²×day), and measurements of the water vapor permeation for an uncoated film give a value of 10.87 g/(m²×day). The $H_2O$ BIF is therefore a factor of 270.

Exemplary Embodiment 10

A 10 ml bottle made from Topas (COC: cycloolefin copolymer) is first of all evacuated on the inside to a base pressure of lower than 0.09 mbar. Subsequently, a mixture of oxygen and hexamethyldisilazane (HMDSN) is passed into the interior of the bottle at a pressure of 0.5 mbar. Then, pulsed microwave energy with a pulse power of 3.5 kW and a frequency of 2.45 GHz is introduced, a plasma is ignited in the container and the container is internally coated with 125 nm of $SiO_x$. Immediately thereafter, the bottle is ventilated and removed. Measurements of the water vapor permeation give a value of 0.14 mg/(specimen×day) for the coated bottle, whereas a water vapor permeation of 0.29 mg/(specimen×day) is measured for the uncoated bottle. This gives a barrier improvement factor (BIF) of 2. Measurements of the oxygen permeability give a value of 0.047 $cm^3$/(specimen×day×bar) for the coated bottle and a value of 0.15 $cm^3$ (specimen×day×bar) for the uncoated bottle, and therefore the $O_2$ BIF is 3.1.

Exemplary Embodiment 11

A 10 ml bottle made from polycarbonate (PC) is first of all evacuated on the inside to a base pressure of less than 0.09 mbar. Subsequently, a mixture of oxygen and hexamethyldisilazane (HMDSN) is passed into the interior of the bottle at a pressure of 1.0 mbar. Then, pulsed microwave energy with a pulse power of 2.8 kW and a frequency of 2.45 GHz is introduced and a plasma is ignited in the container. The inside of the container is coated with 100 nm of $SiO_x$ over the course of 40.3 seconds, corresponding to a deposition rate of 2.48 nm/s. Immediately thereafter, the bottle is ventilated and removed. Measurements of the water vapor permeation give a value of 2.3 mg/(specimen×day) for the coated bottle, whereas a water vapor permeation of 6.6 mg/(specimen×day) is measured for the uncoated bottle. This gives a barrier improvement factor (BIF) of 2.8. Measurements of the oxygen permeability give a value of 0.008 $cm^3$/(specimen×day×bar) for the coated bottle and a value of 0.158 $cm^3$/(specimen×day×bar) for the uncoated bottle, which means a $O_2$ BIF of 19.

The invention claimed is:

1. A composite material comprising:
    a hollow substrate material; and
    at least one barrier coating on an inner side of the hollow substrate material, wherein the at least one barrier coating is a plasma impulse chemical vapor deposition coating, and the at least one barrier coating comprises an alternating layer comprising an inorganic titanium oxide layer in contact with the hollow substrate material, an inorganic silicon oxide layer in contact with the inorganic titanium oxide layer, a second inorganic titanium oxide layer in contact with the inorganic silicon oxide layer, and a second inorganic silicon oxide layer in contact with the second inorganic titanium oxide layer,
    wherein the at least one barrier coating further comprises a layer of a material selected from the group consisting of: amorphous hydrocarbons, $Nb_xO_y$, with $0<x<2$, $0<y<5$, and any combinations thereof.

2. The composite material as claimed in claim 1, wherein the substrate material is a plastic substrate.

3. The composite material as claimed in claim 2, wherein the plastic substrate comprises one or more a material selected from the group consisting of polycyclic hydrocarbons, polycarbonates, polyethylene terephthalates, polystyrene, polyethylene, polypropylene, polymethyl methacrylate, polyether sulfone, and any combinations thereof.

4. The composite material as claimed in claim 3, wherein the polycyclic hydrocarbons comprise cycloolefine polymer.

5. The composite material as claimed in claim 1, further comprising at least one barrier coating on a second side of the substrate material.

6. The composite material as claimed in claim 1, wherein the at least one barrier coating has a thickness less than 1000 nm.

7. The composite material as claimed in claim 6, wherein the at least one barrier coating comprises at least one continuous monomolecular layer.

8. The composite material as claimed in claim 7, wherein the thickness is greater than 20 nm.

9. The composite material as claimed in claim 1, wherein the at least one barrier coating forms a barrier against substances from the atmosphere and/or substances that are in direct contact with the composite material and/or are contained in or released from the substrate material.

10. The composite material as claimed in claim 1, wherein the at least one barrier coating further comprises an optical or electrical functional layer.

11. The composite material as claimed in claim 10, wherein the optical or electrical functional layer is integrated in the at least one barrier coating.

12. The composite material as claimed in claim 1, wherein the at least one barrier coating comprises a gradient layer.

13. The composite material as claimed in claim 1, wherein the at least one barrier coating comprises a stepwise change in stoichiometry and/or structure in a direction perpendicular to the surface of the composite material.

14. The composite material as claimed in claim 1, wherein the alternating layer comprises individual layers having a thickness in a range from 5 nm to 100 nm.

15. The composite material as claimed in claim 1, wherein the silicon oxide layer has a barrier improvement factor of at least 50 with respect to water vapor permeation.

16. The composite material as claimed in claim 1, wherein the inorganic titanium oxide layer and the silicon oxide layer have a water vapor barrier improvement factor of 199.

17. A composite material comprising:
    a hollow plastic material having an inner side; and
    a barrier coating on at least the inner side, the barrier coating comprising a first inorganic titanium oxide layer on the hollow plastic material, a first inorganic silicon oxide layer in contact with the first inorganic titanium oxide layer, a second inorganic titanium oxide layer in contact with the first inorganic silicon oxide layer, and a second inorganic silicon oxide layer in contact with second inorganic titanium oxide layer,
    wherein the barrier coating further comprises a layer of a material selected from the group consisting of amorphous hydrocarbons, $Nb_xO_y$, with $0<x<2$, $0<y<5$, and any combinations thereof.

* * * * *